(12) United States Patent
Ota et al.

(10) Patent No.: US 10,654,375 B2
(45) Date of Patent: *May 19, 2020

(54) DRIVABLE DISTANCE CALCULATION DEVICE AND DRIVABLE DISTANCE CALCULATION METHOD

(71) Applicant: Nissan Motor Co., Ltd., Yokohama-shi, Kanagawa (JP)

(72) Inventors: Satomi Ota, Ebina (JP); Naoki Yamamoto, Hachioji (JP); Kenichi Gotou, Ayase (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,839

(22) Filed: Aug. 14, 2018

(65) Prior Publication Data

US 2019/0001835 A1 Jan. 3, 2019

Related U.S. Application Data

(63) Continuation of application No. 14/432,308, filed as application No. PCT/JP2013/076512 on Sep. 30, 2013, now Pat. No. 10,076,968.

(30) Foreign Application Priority Data

Oct. 2, 2012 (JP) ................................. 2012-219930

(51) Int. Cl.
*B60L 58/12* (2019.01)
*G01C 21/34* (2006.01)
*G01B 7/02* (2006.01)
*G01R 31/36* (2020.01)

(52) U.S. Cl.
CPC ................ *B60L 58/12* (2019.02); *G01B 7/02* (2013.01); *G01C 21/3469* (2013.01);
(Continued)

(58) Field of Classification Search
CPC .. B60L 11/1861; B60L 58/12; G01C 21/3469; G01B 7/02; G01R 31/3648
See application file for complete search history.

(56) References Cited

U.S. PATENT DOCUMENTS

| | | | |
|---|---|---|---|
| 8,521,408 B2 * | 8/2013 | Cho | ........................ B60L 53/60 701/123 |
| 2011/0166810 A1 | 7/2011 | Grader et al. | |

(Continued)

FOREIGN PATENT DOCUMENTS

| | | | |
|---|---|---|---|
| JP | 2001119802 A | 4/2001 | |
| JP | 2006115623 A | 4/2006 | |

(Continued)

*Primary Examiner* — Bryan Bui
(74) *Attorney, Agent, or Firm* — Young Basile Hanlon & MacFarlane, P.C.

(57) ABSTRACT

A drivable distance calculation device calculates a drivable distance that the vehicle equipped with the device can travel. The drivable distance calculation device includes a remaining battery capacity sensor which calculates a remaining capacity of a battery installed in the vehicle; and a arithmetic unit which calculates multiple power consumption ratios for different units of driving in accordance with variations in the remaining battery capacity calculated by the remaining battery capacity sensor and calculates the drivable distance based on the remaining battery capacity calculated by the remaining battery capacity sensor and a power consumption ratio selected from among the calculated multiple power consumption ratios.

18 Claims, 4 Drawing Sheets

(52) U.S. Cl.
CPC ...... *G01R 31/3648* (2013.01); *B60L 2240/12* (2013.01); *B60L 2240/547* (2013.01); *B60L 2240/549* (2013.01); *B60L 2240/622* (2013.01); *B60L 2250/10* (2013.01); *B60L 2250/16* (2013.01); *B60L 2260/52* (2013.01); *B60L 2260/54* (2013.01); *Y02T 10/705* (2013.01); *Y02T 10/7005* (2013.01); *Y02T 10/7044* (2013.01); *Y02T 10/7291* (2013.01); *Y02T 90/16* (2013.01); *Y02T 90/161* (2013.01); *Y02T 90/162* (2013.01)

(56) References Cited

U.S. PATENT DOCUMENTS

| | | | |
|---|---|---|---|
| 2011/0246252 | A1 | 10/2011 | Uesugi |
| 2012/0126754 | A1* | 5/2012 | Akahane ............. H01M 10/441 320/137 |
| 2012/0143413 | A1 | 6/2012 | Cho et al. |
| 2012/0143435 | A1 | 6/2012 | Cho et al. |
| 2014/0074329 | A1 | 3/2014 | Yang et al. |
| 2015/0316389 | A1 | 11/2015 | Inoue et al. |

FOREIGN PATENT DOCUMENTS

| | | |
|---|---|---|
| JP | 2009171646 A | 7/2009 |
| JP | 2011142757 A | 7/2011 |
| JP | 2011253257 A | 12/2011 |
| JP | 2012120420 A | 6/2012 |
| JP | 2012146016 A | 8/2012 |

* cited by examiner

DRIVABLE DISTANCE CALCULATION DEVICE AND DRIVABLE DISTANCE CALCULATION METHOD

CROSS-REFERENCE TO RELATED APPLICATIONS

This application is a continuation of U.S. patent application Ser. No. 14/432,308 filed Mar. 30, 2015, which is a 371 of PCT/JP2013/076512 filed Sep. 30, 2013, which claims priority to Japanese Patent Application No. 2012-219930 filed Oct. 2, 2012, all incorporated herein in their entirety.

TECHNICAL FIELD

The present invention relates to a drivable distance calculation device and a drivable distance calculation method.

BACKGROUND

A conventionally proposed drivable distance calculation device estimates the drivable distance based on a remaining capacity of an in-vehicle battery of an electric vehicle. When the destination or route is set in a navigation system, the calculation device estimates the drivable distance by comparing the consumption of the battery with the remaining capacity of the battery for each link included in the route to the destination or the set route (see Japanese Patent Application Laid Open Publication No. 2006-115623). The calculation device of Japanese Patent Application Laid-open Publication No. 2006-115623 cannot estimate the drivable distance when the route is not set. To estimate the drivable distance when the route is not set, the drivable distance may be calculated based on the consumption of the battery at the link where the vehicle is currently traveling or based on the consumption of the battery which is indefinitely predicted from daily driving.

In the former case, since the drivable distance is estimated based on the battery consumption in the link at the time of the estimation, the instantaneous accuracy of the estimated drivable distance is high but the estimated drivable distance can change considerably each time the vehicle travels to a different link. If the drivable distance is reduced suddenly, the driver is likely to have a feeling of anxiety. If the drivable distance is increased suddenly, the driver is likely to rely on the estimated drivable distance excessively. In the latter case, the drivable distance does not change significantly, but its problem in accuracy simply increases the risk of running out of electricity when the remaining capacity of the battery becomes small.

SUMMARY

The present invention has been made to solve the above-described conventional problems, and an object of the present invention is to provide a drivable distance calculation device and a drivable distance calculation method which are capable of reducing the feeling of anxiety and the like given to the driver and reducing the risk of running out of electricity.

The drivable distance calculation device and drivable distance calculation method of the present invention that calculate a plurality of power consumption ratios for different units of driving; store the plurality of power consumption ratios in accordance with a remaining capacity of a battery; and calculate a drivable distance based on the remaining capacity of the battery and a power consumption ratio selected from among the plurality of power consumption ratios stored.

DESCRIPTION OF EMBODIMENTS

Figure 1:
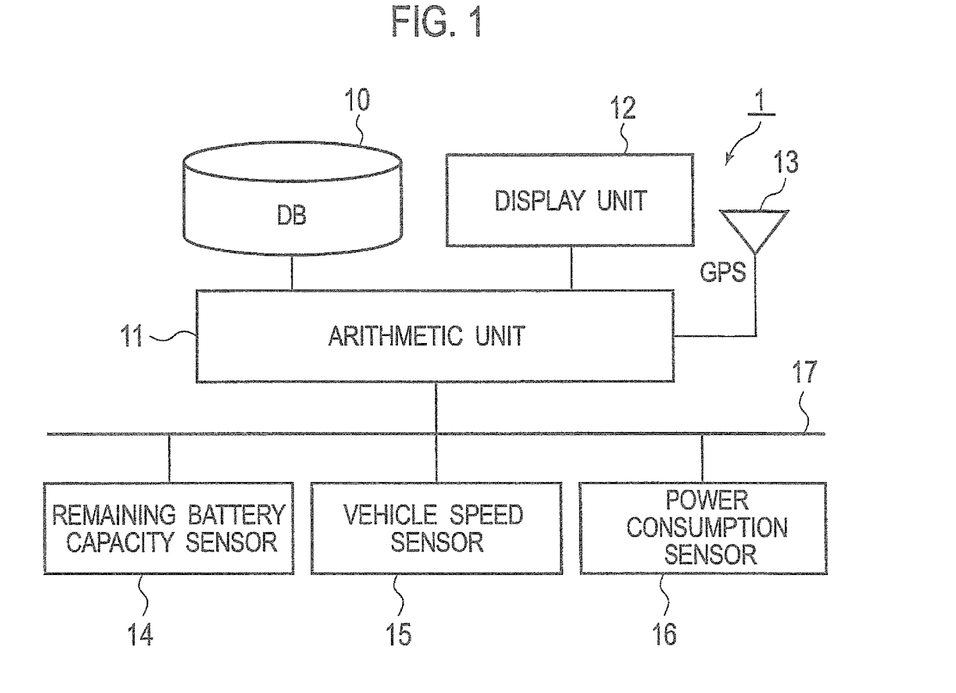
FIG. 1 is a schematic configuration diagram illustrating a drivable distance calculation device according to first to seventh embodiments.

Hereinafter, a description is given of first to seventh embodiments of the present invention based on the drawings. FIG. 1 is a schematic configuration diagram illustrating a drivable distance calculation device according to the first to seventh embodiments. A drivable distance calculation device 1 is installed in an electric vehicle, for example. As illustrated in FIG. 1, the drivable distance calculation device 1 includes a database (DB) 10, an arithmetic unit (power consumption ratio calculation means, drivable distance calculation means) 11, a display unit 12, and a GPS receiving unit 13.

First Embodiment

The DB 10 stores plural power consumption ratios for different units of driving. The units of driving include driving distances or driving times, for example. In this case, the DB 10 stores plural power consumption ratios for driving distances or driving times. The arithmetic unit 11 includes a drivable distance calculation function and is configured to calculate the drivable distance based on the power consumption ratios stored in the DB 10.

The display unit 12 is a display configured to display the drivable distance calculated by the arithmetic unit 11. The GPS receiving unit 13 receives radio waves from a GPS satellite. The arithmetic unit 11 detects the position of a vehicle equipped with the device 1 based on the radio waves received by the GPS receiving unit 13.

The drivable distance calculation device 1 further includes a remaining battery capacity sensor (remaining capacity calculation means) 14, a vehicle speed sensor 15, and a power consumption sensor 16. The arithmetic unit 11 is connected to the sensors 14 to 16 through a CAN (a controller area network) 17.

The remaining battery capacity sensor 14 calculates a remaining capacity of a battery. The remaining battery capacity sensor 14 includes a function of calculating the remaining battery capacity based on the battery voltage or calculating the remaining battery capacity based on the balance of charging and discharging. The vehicle speed sensor 15 is provided for a wheel and calculates the vehicle speed based on the number of pulses corresponding to the rotation of the wheel. The power consumption sensor 16 detects the amount of discharge from the battery and calculates the power consumption based on the detected amount of discharge.

Moreover, the arithmetic unit 11 includes a power consumption ratio calculation function. The arithmetic unit 11 calculates plural power consumption ratios for units of driving, including trips, certain driving distances, or certain driving times, for example, from past travels, based on information from the sensors 14 to 16. The arithmetic unit 11 causes the DB 10 to store or update the same. To be more specific, when the units of driving are driving distances, the arithmetic unit 11 calculates the power consumption ratio of $\beta$ m-drive ($\beta$ is lifelong driving distance, for example) based on the past travels and the power consumption ratio of $\gamma$ m-drive ($\gamma$ is the latest 100 m, for example), for example. When the units of driving are driving times, the arithmetic unit 11 calculates the power consumption ratio of $\beta$ hour drive ($\beta$ is previous 100 hours, for example) and the power consumption ratio of $\gamma$ minute drive ($\gamma$ is the latest 10 minutes, for example). Moreover, the arithmetic unit 11 stores the calculated power consumption ratios in the DB 10. In the following description, the units of driving are assumed to be driving distances.

The DB 10 stores the plural power consumption ratios calculated by the arithmetic unit 11 as described above in association with remaining battery capacity. For example, the DB 10 stores the power consumption ratio of $\beta$ m-drive in association with the remaining battery capacity $\geq \alpha$ (kWh) and stores the power consumption ratio of $\gamma$ m-drive in association with the remaining battery capacity $<\alpha$ (kWh).

The aforementioned $\alpha$ is the remaining capacity at which the driver is informed that the battery is nearly depleted, for example. When the remaining capacity is smaller than $\alpha$, an empty warning light illuminates, or the output of the battery is limited.

In the thus-configured drivable distance calculation device 1, the arithmetic unit 11 selects a power consumption ratio corresponding to the current remaining capacity calculated by the remaining battery capacity sensor 14 from among the plural power consumption ratios. The arithmetic unit 11 calculates the drivable distance based on the selected power consumption ratio and the remaining battery capacity.

Specifically, when the remaining battery capacity $\geq \alpha$ (kWh), the arithmetic unit 11 selects the power consumption ratio of $\beta$ m-drive and calculates the drivable distance based on Equation (1) of: drivable distance (km)=power consumption ratio of $\beta$ m-drive (km/kWh)×remaining battery capacity (kWh). When the remaining battery capacity $<\alpha$ (kWh), the arithmetic unit 11 selects the power consumption ratio of $\gamma$ m-drive and calculates the drivable distance based on Equation (2) of: drivable distance (km)=power consumption ratio of $\gamma$ m-drive (km/kWh)×remaining battery capacity (kWh).

Herein, as described above, the magnitude relation between $\beta$ and $\gamma$ is $\gamma > \beta$. As the remaining battery capacity becomes smaller, the arithmetic unit 11 selects a power consumption ratio of a shorter driving distance. To be more specific, the arithmetic unit 11 selects a power consumption ratio of a short driving distance when the remaining battery capacity is smaller than the predetermined value $\alpha$. The arithmetic unit 11 selects a power consumption ratio of a driving distance longer than the short driving distance when the remaining battery capacity is not smaller than the predetermined value $\alpha$. In such a manner, the drivable distance calculation device 1 according to the first embodiment calculates the drivable distance by using a power consumption ratio of a long driving distance when the remaining battery capacity is large, for example. This can prevent the drivable distance from changing significantly and reduce the feeling of anxiety and the like given to the driver. On the other hand, the drivable distance calculation device 1 calculates the drivable distance by using a power consumption ratio of a short driving distance when the remaining battery capacity is small, for example. This can increase the accuracy of calculating the drivable distance and thereby reduce the risk of running out of electricity.

Figure 2:
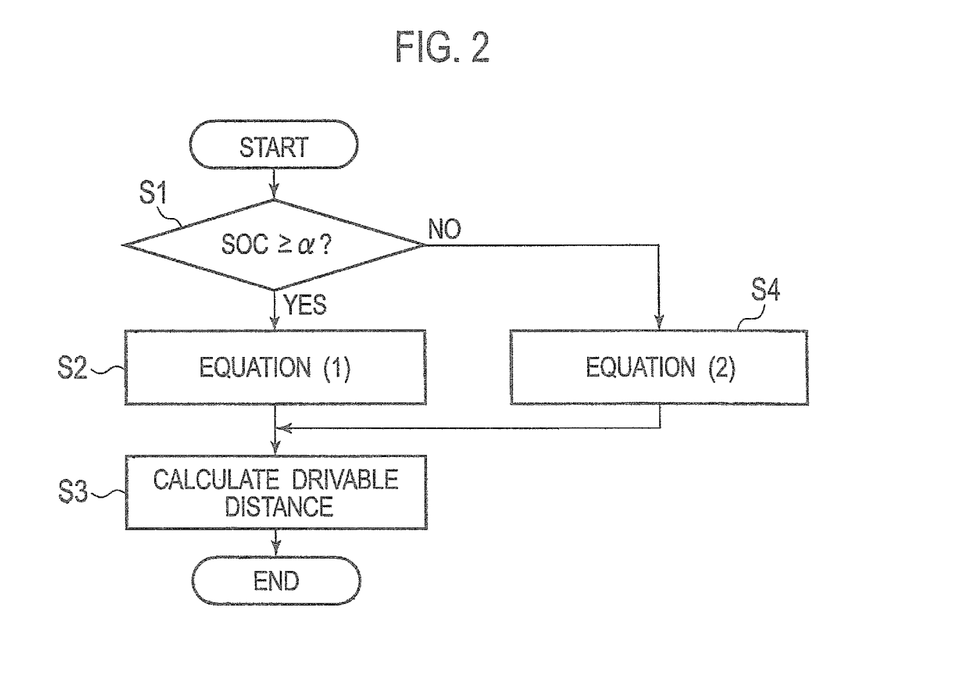
FIG. 2 is a flowchart showing a drivable distance calculation method according to the first embodiment.

Next, a description is given of a drivable distance calculation method according to the first embodiment with reference to the flowchart of FIG. 2. FIG. 2 is a flowchart showing the drivable distance calculation method according to the first embodiment. As shown in FIG. 2, first, the arithmetic unit 11 determines whether the remaining battery capacity (SOC) is equal to or larger than the predetermined value $\alpha$ (S1).

When determining that the remaining battery capacity is equal to or larger than the predetermined value $\alpha$ (S1: YES), the arithmetic unit 11 selects Equation (1) described above (S2), that is, selects the power consumption ratio of $\beta$ m-drive to calculate the drivable distance (S3). The process shown in FIG. 2 is terminated.

On the other hand, when determining that the remaining battery capacity is smaller than the predetermined $\alpha$ (S1: NO), the arithmetic unit 11 selects Equation (2) described above (S4), that is, selects the power consumption ratio of $\gamma$ m-drive to calculate the drivable distance (S3). The process shown in FIG. 2 is terminated.

After calculating the drivable distance, the arithmetic unit 11 sends information on the drivable distance to the display unit 12, and the display unit 12 displays the drivable distance to inform the driver.

In the first embodiment, the DB 10 stores only two power consumption ratios, but not limited to the above case, and may store three or more power consumption ratios. In this case, instead of only determining whether the remaining battery capacity is equal to or larger than the predetermined $\alpha$, the arithmetic unit 11 compares the remaining battery capacity with first, second, and other predetermined values and selects a power consumption ratio appropriate to the remaining battery capacity.

According to the drivable distance calculation device 1 and drivable distance calculation method of the first embodiment, when the remaining battery capacity is large, for example, the drivable distance is calculated by employing a power consumption ratio of a long driving distance (unit of driving) or a power consumption ratio of a long driving time (unit of driving). This can prevent the calculated drivable distance from changing significantly and reduce the feeling of anxiety and the like given to the driver. On the other hand, when the remaining battery capacity is small, for example, the drivable distance is calculated by employing a power consumption ratio of a short driving distance (unit of driving) or a power consumption ratio of a short driving time (unit of driving). This can increase the accuracy of calculating the drivable distance and reduce the risk of running out of electricity.

According to the first embodiment, the power consumption ratio corresponding to the current remaining battery capacity is selected from among the plural power consumption ratios stored. This means that the power consumption ratio corresponding to the current remaining battery capacity that will not change rapidly is selected. It is therefore possible to reduce the frequency at which the drivable distance changes significantly, making it less likely that the driver has the feeling of anxiety and relies on the calculated drivable distance excessively.

According to the first embodiment, as the remaining battery capacity becomes lower, the drivable distance is calculated by selecting a power consumption ratio of a shorter driving distance (smaller unit of driving). This can increase the accuracy of calculating the drivable distance when the remaining battery capacity is small, thus reducing the risk of running out of electricity.

According to the first embodiment, when the remaining battery capacity is smaller than the predetermined value α, the drivable distance is calculated by using the power consumption ratio of a short driving distance (small unit of driving). When the remaining battery capacity is not smaller than the predetermined value α, the drivable distance is calculated by using the power consumption ratio of a long driving distance (large unit of driving). It is therefore possible to prevent the calculated drivable distance from changing significantly when a certain level of battery capacity remains and thereby reduce the feeling of anxiety and the like given to the driver. Moreover, it is possible to increase the accuracy of calculating the drivable distance when the remaining battery capacity becomes small, thus reducing the risk of running out of electricity.

Second Embodiment

Next, a description is given of a second embodiment of the present invention. A drivable distance calculation device 1 and a drivable distance calculation method according to the second embodiment are the same as those of the first embodiment but are different from those of the first embodiment in terms of a part of the process. Hereinafter, the different points from the first embodiment are described.

The drivable distance calculation device 1 according to the first embodiment includes a function of determining whether the vehicle is in a driving environment that will degrade the vehicle's power consumption ratio. To be specific, the DB 10 of the second embodiment stores map information. The arithmetic unit 11 specifies the position of the vehicle based on radio waves received by the GPS receiving unit 13 and compares the position of the vehicle with the map information to determine whether the vehicle is in a driving environment that will degrade the power consumption ratio. In this process, the arithmetic unit 11 determines that the vehicle is in a driving environment that will degrade the power consumption ratio when the vehicle is located on a highway, in a mountain area, in a hill area, or the like. To determine whether the vehicle is located in a mountain area or a hill area, the arithmetic unit 11 may use the average gradient (%) of the road.

Moreover, when determining that the vehicle is located in a driving environment that will degrade the power consumption ratio in the second embodiment, the arithmetic unit 11 calculates the drivable distance by selecting a power consumption ratio of a shorter driving distance (smaller unit of driving). This can increase the accuracy of calculating the drivable distance when the remaining battery capacity is reduced significantly and thereby reduce the risk of running out of electricity.

Figure 3:
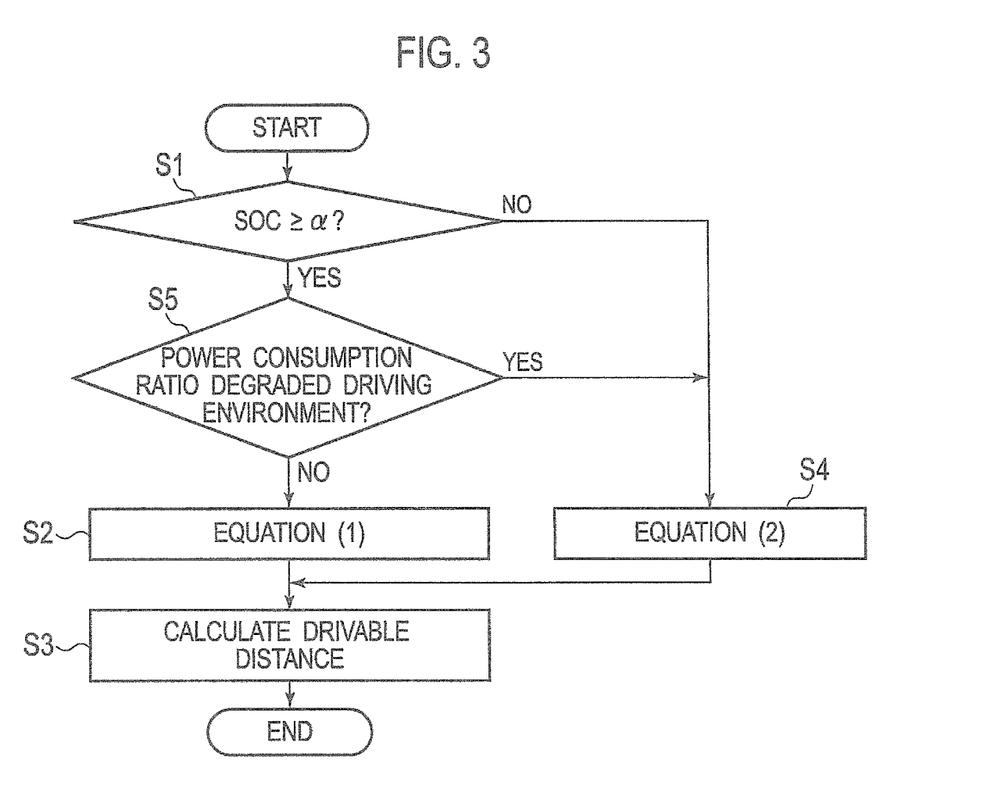
FIG. 3 is a flowchart showing a drivable distance calculation method according to the second embodiment.

FIG. 3 is a flowchart showing the drivable distance calculation method according to the second embodiment. The same steps in FIG. 3 as those of FIG. 2 are given the same reference numerals, and the description thereof is omitted.

As shown in FIG. 3, when the remaining battery capacity is equal to or higher than the predetermined value α (S1: YES), the arithmetic unit 11 determines whether the vehicle is in a power consumption ratio degraded driving environment (S5). When determining that the vehicle is not in the power consumption ratio degraded driving environment (S5: NO), the arithmetic unit 11 selects Equation (1) described above (S2), that is, selects the power consumption ratio of m-drive to calculate the drivable distance (S3). The process shown in FIG. 3 is then terminated.

On the other hand, when determining that the vehicle is in the power consumption ratio degraded driving environment (S5: YES), the arithmetic unit 11 selects Equation (2) described above (S4), that is, selects the power consumption ratio of γ m-drive to calculate the drivable distance (S3). The process shown in FIG. 3 is then terminated. In other words, when the vehicle travels in a driving environment that will degrade the vehicle's power consumption ratio, the arithmetic unit 11 selects a power consumption ratio of a shorter driving distance (smaller unit of driving), increasing the accuracy of calculating the drivable distance and reducing the risk of running out of electricity.

In the second embodiment, the DB 10 stores two power consumption ratios, but not limited to this case, and the DB 10 may store three or more power consumption ratios. In the second embodiment, the arithmetic unit 11 determines whether the power consumption ratio will be degraded (whether the degradation degree of power consumption ratio is 0 or 1) but not limited to this. The arithmetic unit 11 may calculate degradation degree of power consumption ratio in various manners. In this case, the degradation degree of power consumption ratio is set to 1 when the vehicle is located on a highway, in a mountain area, in a hill area, or the like for example, and is set to 2 when the road gradient is not less than a predetermined percent. As the degradation degree of power consumption ratio becomes higher, the drivable distance is calculated by using a power consumption ratio of a shorter drivable distance for unit of power.

According to the drivable distance calculation device 1 and drivable distance calculation method of the second embodiment, it is possible to reduce the feeling of anxiety and the like given to the driver and reduce the risk of running out of electricity in a similar manner to the first embodiment.

According to the second embodiment, as the degradation degree of power consumption ratio based on the information on road that the vehicle travels becomes higher, the power consumption ratio of a shorter driving distance (smaller unit of driving) is selected. Accordingly, when the vehicle is traveling on a highway or in a mountain area where the power consumption ratio is degraded, for example, the drivable distance is calculated by using a power consumption ratio of a shorter driving distance (smaller unit of driving). This can increase the accuracy of calculating the drivable distance and further reduce the risk of running out of electricity.

Third Embodiment

Next, a description is given of a third embodiment of the present invention. A drivable distance calculation device 1 and a drivable distance calculation method according to the third embodiment are the same as those of the first embodiment but are different from those of the first embodiment in terms of a part of the process. Hereinafter, the different points from the first embodiment are described.

In the first embodiment, the arithmetic unit 11 selects one of the power consumption ratios stored in the DB 10 and calculates the drivable distance based on the selected power consumption ratio. In the third embodiment, the arithmetic unit 11 selects two or more power consumption ratios and calculates the drivable distance with the selected power consumption ratios weighted based on the remaining battery capacity.

To be specific, when the remaining battery capacity is equal to or larger than the predetermined value α, the arithmetic unit 11 calculates the drivable distance by multiplying a power consumption ratio of a short driving distance (small unit of driving) by the predetermined value α and multiplying a power consumption ratio of a driving distance (long unit of driving) longer than the short driving distance by the value obtained by reducing the predetermined value α from the remaining battery capacity. To be more specific, when the remaining battery capacity ≥α (kWh), the arithmetic unit 11 selects two power consumption ratios of β m-drive and γ m-drive drive and calculates the drivable distance based on Equation (3) of: drivable distance (km)=power consumption ratio of β m-drive (km/kWh)×(remaining battery capacity−α (kWh))+power consumption ratio of γ m-drive (km/kWh)×α (kWh). In this case, the weights to the power consumption ratios of β m-drive and γ m-drive are (remaining battery capacity−α) and α, respectively.

When the remaining battery capacity <α (kWh), the arithmetic unit 11 selects two power consumption ratios of β m-drive and γ m-drive and calculates the drivable distance based on Equation (2) of: drivable distance (km)=power consumption ratio of γ m-drive (km/kWh)×remaining battery capacity (kWh). In this case, the weights to the power consumption ratios of β m-drive and γ m-drive are 0 and the remaining battery capacity (100%), respectively. Since the former weight is 0, the arithmetic unit 11 calculates the drivable distance based on the same equation as Equation (2) of the first embodiment when the remaining battery capacity <α (kWh).

As described above, the arithmetic unit 11 according to the third embodiment weights the selected power consumption ratios and calculates the drivable distance with the weight to the power consumption ratio of the shorter driving distance (smaller unit of driving) set larger especially when the remaining battery capacity is small, thus reducing the risk of running out of electricity.

Figure 4:
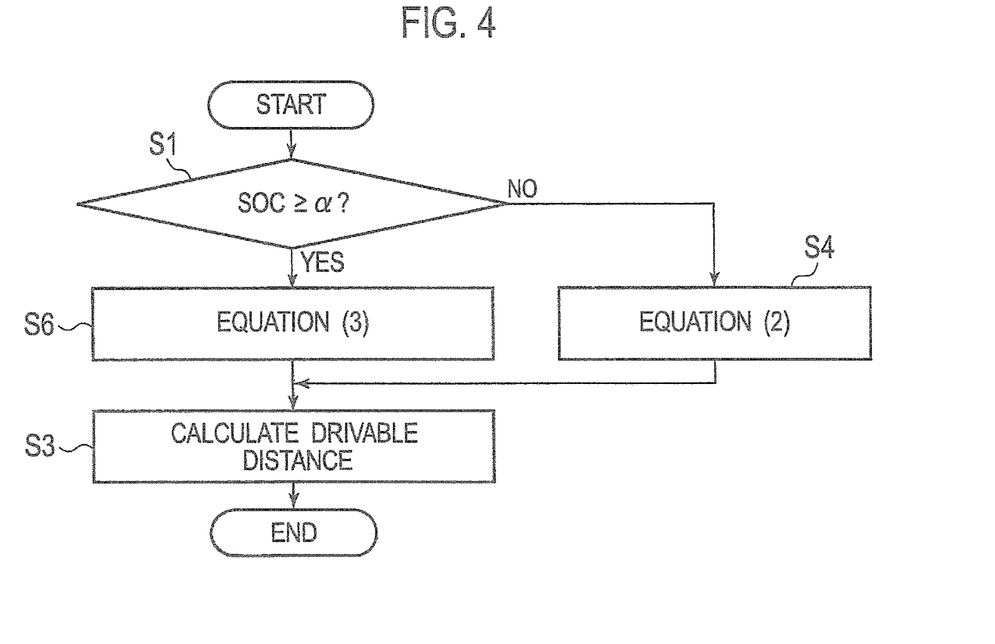
FIG. 4 is a flowchart showing a drivable distance calculation method according to the third embodiment.

FIG. 4 is a flowchart showing the drivable distance calculation method according to the third embodiment. The same steps in FIG. 4 as those of FIG. 2 are given the same reference numerals, and the description thereof is omitted.

As shown in FIG. 4, when the remaining battery capacity is equal to or larger than the predetermined value α (S1: YES), the arithmetic unit 11 selects Equation (3) described above (S6), that is, selects two power consumption ratios of β m-drive and γ m-drive and calculates the drivable distance with the two power consumption ratios individually weighted (S3). The process shown in FIG. 4 is then terminated.

In this process, as for the weights in the step S6, the weights to the power consumption ratios of β m-drive and γ m-drive are (remaining battery capacity−α) and α, respectively, and the weights appropriate to the remaining battery capacity are set.

On the other hand, when determining that the remaining battery capacity is smaller than the predetermined value α (S1: NO), the arithmetic unit 11 selects Equation (2) described above (S4), that is, selects two power consumption ratios of β m-drive and γ m-drive and calculates the drivable distance with the two power consumption ratios individually weighted (S3). In this process, as for the weights in the step S4, the weights to the power consumption ratios of β m-drive and γ m-drive are 0 and the remaining battery capacity (100%), respectively, and the weights appropriate to the remaining battery capacity are set.

In the third embodiment, the DB 10 stores two power consumption ratios, but not limited to this case, and the DB 10 may store three or more power consumption ratios. In this case, instead of only determining whether the remaining battery capacity is smaller than the predetermined value α, the arithmetic unit 11 compares the remaining battery capacity with the first, second, and other predetermined values to set weights to the power consumption ratios in accordance with the remaining battery capacity. In the third embodiment, it is necessary to select two or more power consumption ratios from among the plural power consumption ratios stored in the DB 10 and is unnecessary to select all of the power consumption ratios stored.

As described above, according to the drivable distance calculation device 1 and drivable distance calculation method according to the third embodiment, it is possible to reduce the feeling of anxiety and the like given to the driver and reduce the risk of running out of electricity in a similar manner to the first embodiment.

According to the third embodiment, the drivable distance is calculated by selecting two or more power consumption ratios and individually weighting the selected power consumption ratios based on the remaining battery capacity. Accordingly, when the remaining battery capacity is small, for example, the weight to the power consumption ratio of a short driving distance (small unit of driving) can be set large, when the remaining battery capacity is sufficient, the weight to the power consumption ratio of a short driving distance (small unit of driving) is set small. It is therefore possible to reduce the feeling of anxiety and the like given to the driver and reduce the risk of running out of electricity.

According to the third embodiment, when the remaining battery capacity is equal to or larger than the predetermined value α, the drivable distance is calculated by multiplying the power consumption ratio of a short driving distance (small unit of driving) by the predetermined value α and by multiplying the power consumption ratio of a long driving distance (large unit of driving) by the value obtained by reducing the predetermined value α from the remaining battery capacity. For the drivable distance is calculated in such a manner, the weight to the power consumption ratio of a short driving distance (small unit of driving) is set to the predetermined value α while the power consumption ratio of a long driving distance (large unit of driving) is set to (remaining battery capacity−predetermined value α), thus weighting the power consumption ratios appropriate to the remaining battery capacity.

According to the third embodiment, as the remaining battery capacity becomes smaller, the weight to the power consumption ratio of a short driving distance (small unit of driving) is set larger. This can increase the accuracy of calculating the drivable distance when the remaining battery capacity is small and therefore reduce the risk of running out of electricity.

According to the third embodiment, when the remaining battery capacity is equal to or smaller more than the predetermined value, the weight to the power consumption ratio of the shortest driving distance (the smallest unit of driving) is set to 100%. This can further increase the accuracy of calculating the drivable distance when the remaining battery capacity is small and therefore further reduce the risk of running out of electricity.

Fourth Embodiment

Next, a description is given of a fourth embodiment of the present invention. A drivable distance calculation device 1 and a drivable distance calculation method according to the fourth embodiment are the same as those of the third embodiment but are different from those of the third embodiment in terms of a part of the process. Hereinafter, the different points from the third embodiment are described.

The arithmetic unit 11 according to the fourth embodiment calculates plural power consumption ratios corresponding to drivers of the vehicle, and the DB 10 stores the power consumption ratios corresponding to the drivers which are calculated by the arithmetic unit 11. The DB 10 may store a power consumption ratio for each driver or may store a power consumption ratio for each type of driver which is classified into a rough driver group or a moderate driver group. The drivers (types) may be specified by inputting driver's information into the calculation device 1 or may be specified by the arithmetic unit 11 based on the manner of traveling.

The arithmetic unit 11 calculates the drivable distance in the following manner. To be specific, when the remaining battery capacity is equal to or larger than the predetermined value a, the arithmetic unit 11 selects the power consumption ratios of β m-drive and γ m-drive corresponding to a driver from the DB 10. The arithmetic unit 11 calculates the drivable distance based on Equation (4) of: drivable distance (km)=power consumption ratio of γ m-drive of driver A (km/kWh)×(remaining battery capacity−α (kWh))+power consumption ratio of γm-drive of the driver A (km/kWh)×α (kWh). In this case, the weights of the power consumption ratios of β m-drive and γ m-drive of driver A are (remaining battery capacity−α) and α, respectively.

The aforementioned example is a case of the driver (type) A. In the case of a different driver (type)B, the arithmetic unit 11 similarly calculates the drivable distance based on Equation (4) of: drivable distance (km)=power consumption ratio of β m-drive of driver B (km/kWh)×(remaining battery capacity−α (kWh))+power consumption ratio of γ m-drive of driver B (km/kWh)×α (kWh).

When the remaining battery capacity <α (kWh), the arithmetic unit 11 selects the two power consumption ratios of β m-drive and γ m-drive and calculates the drivable distance based on Equation (2) of: drivable distance (km) =power consumption ratio of γ m-drive (km/kWh)×remaining battery capacity (kWh).

As described above, the drivable distance is calculated by selecting power consumption ratios corresponding to the driver (type) in the fourth embodiment, thus increasing the accuracy of calculating the drivable distance.

Figure 5:
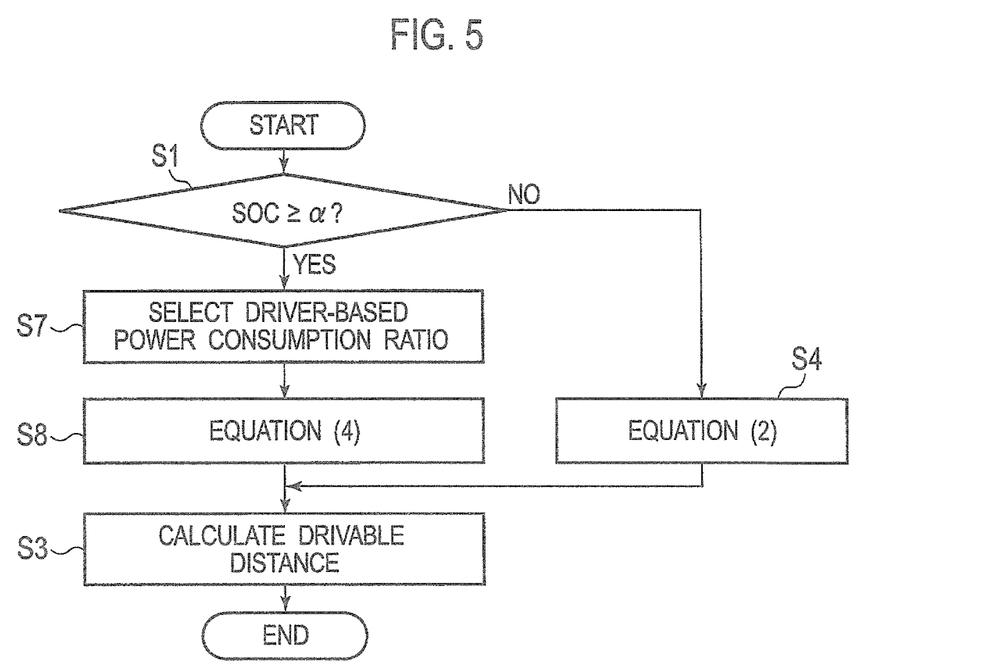
FIG. 5 is a flowchart showing a drivable distance calculation method according to the fourth embodiment.

FIG. 5 is a flowchart showing the drivable distance calculation method according to the fourth embodiment. The same steps in FIG. 5 as those in FIG. 4 are given the same reference numerals, and the description thereof is omitted.

As shown in FIG. 5, when the remaining battery capacity is equal to or larger than the predetermined value α (S1: YES), the arithmetic unit 11 selects the power consumption ratio of β m-drive corresponding to the current driver (S7). In the step S7, the arithmetic unit 11 selects the power consumption ratio of γ m-drive corresponding to the current driver.

Next, the arithmetic unit 11 selects Equation (4) described above (S8) and calculates the drivable distance with the power consumption ratios of β m-drive and γ m-drive corresponding to the current driver both weighted (S3). The process shown in FIG. 5 is terminated.

In the fourth embodiment, when determining that the remaining battery capacity is equal to or larger than the predetermined value α (S1: YES), the arithmetic unit 11 selects a power consumption ratio corresponding to the driver but not limited to this. The arithmetic unit 11 may select a power consumption ratio corresponding to the driver when the remaining battery capacity is smaller than the predetermined value α (S1: NO).

According to the drivable distance calculation device 1 and drivable distance calculation method according to the fourth embodiment, it is possible to reduce the feeling of anxiety and the like given to the driver and reduce the risk of running out of electricity in a similar manner to the third embodiment.

According to the fourth embodiment, plural power consumption ratios are calculated corresponding to drivers who drive the vehicle, and the drivable distance can be therefore calculated by taking account of power consumption ratios different from driver to driver, for example, thus increasing the accuracy of calculating the drivable distance.

Fifth Embodiment

Next, a description is given of a fifth embodiment of the present invention. A drivable distance calculation device 1 and a drivable distance calculation method according to the fifth embodiment are the same as those of the third embodiment but are different from those of the third embodiment in terms of a part of the process. Hereinafter, the different points from the third embodiment are described.

The drivable distance calculation device 1 and drivable distance calculation method according to the fifth embodiment are configured to select two or more power consumption ratios based on the remaining battery capacity in a similar manner to the third embodiment and also select the power consumption ratios based on whether the vehicle is in a driving environment that will degrade the power consumption ratio in a similar manner to the second embodiment.

The arithmetic unit 11 of the fifth embodiment calculates the drivable distance in the following manner. To be specific, when the remaining battery capacity ≥α (kWh) and the vehicle is located in the driving environment that will degrade the power consumption ratio, the arithmetic unit 11 according to the fifth embodiment selects two power consumption ratios of β m-drive and γ m-drive and calculates the drivable distance based on Equation (2) of: drivable distance (km)=power consumption ratio of γ m-drive (km/kWh)×remaining battery capacity (kWh). In this case, the weights to the power consumption ratios of β m-drive and γ m-drive are 0 and the remaining battery capacity (100%), respectively.

When the remaining battery capacity ≥α (kWh) and the vehicle is not located in a driving environment that will degrade the power consumption ratio, the arithmetic unit 11 selects two power consumption ratios of β m-drive and γ m-drive and calculates the drivable distance based on Equation (3) of: drivable distance (km)=power consumption ratio of β m-drive (km/kWh)×(remaining battery capacity−α (kWh))+power consumption ratio of γ m-drive (km/kWh)×α (kWh). In this case, the weights of the power consumption ratios of β m-drive and γ m-drive are (the remaining battery capacity−α) and α, respectively.

When the remaining battery capacity <α (kWh), the arithmetic unit 11 selects two power consumption ratios of β m-drive and γ m-drive and calculates the drivable distance based on Equation (2) of: drivable distance (km)=power consumption ratio of γ m-drive (km/kWh)×remaining battery capacity (kWh). In this case, the weights to the power consumption ratios of β m-drive and γ m-drive are 0 and the remaining battery capacity (100%), respectively.

As described above, in the fifth embodiment, the weights are changed based on driving environments that will degrade the power consumption ratio, thus further reducing the risk of running out of electricity.

Figure 6:
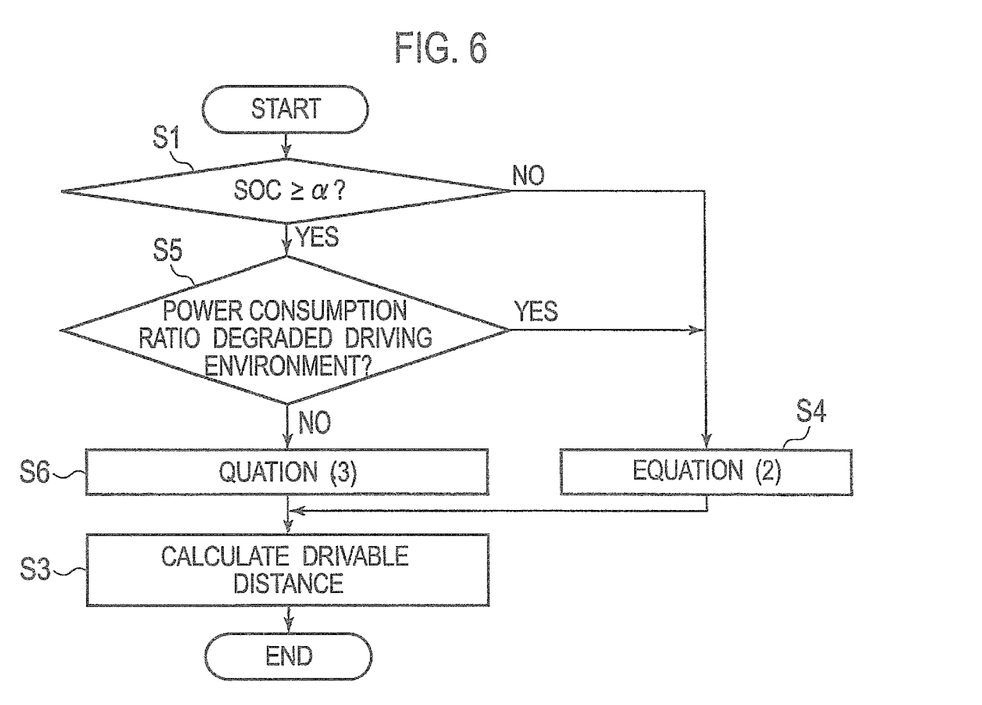
FIG. 6 is a flowchart showing a drivable distance calculation method according to the fifth embodiment.

FIG. 6 is a flowchart showing the drivable distance calculation method according to the fifth embodiment. The same steps in FIG. 6 as those of FIG. 4 are given the same reference numerals, and the description thereof is omitted.

As shown in FIG. 6, when determining that the remaining battery capacity is equal to or larger than the predetermined value α (S1: YES), the arithmetic unit 11 determines whether the vehicle is located in the power consumption ratio degraded driving environment (S5). When determining that the vehicle is not located in the power consumption ratio degraded driving environment (S5: NO), the arithmetic unit 11 selects Equation (3) described above (S6), that is, selects two power consumption ratios of β m-drive and γ m-drive and calculates the drivable distance with the two power consumption ratios individually weighted (S3). The process shown in FIG. 6 is then terminated.

On the other hand, when determining that the vehicle is located in the power consumption ratio degraded driving environment (S5: YES), the arithmetic unit 11 selects Equation (2) described above (S4), that is, selects two power consumption ratios of β m-drive and γ m-drive and calculates the drivable distance with the two power consumption ratios individually weighted (S3). The process shown in FIG. 6 is then terminated. In other words, since the vehicle is located in a driving environment that will degrade the power consumption ratio, the arithmetic unit 11 sets high (to 100%) the weight to the power consumption ratio of the short driving distance (small unit of driving), thus increasing the accuracy of calculating the drivable distance and reducing the risk of running out of electricity.

In the fifth embodiment, the degradation degree of power consumption ratio may be calculated in a similar manner to the second embodiment. To be specific, the degradation degree of power consumption ratio may be set to 1 when the vehicle is located on a highway, in a mountain area, in a hill area, or the like, for example. Moreover, the degradation degree of power consumption ratio may be set to 2 when the road gradient is not less than a predetermined percent. As the degradation degree of power consumption ratio becomes higher, the drivable distance is calculated by using a power consumption ratio of a shorter possible driving distance per unit of power.

As described above, according to the drivable distance calculation device 1 and drivable distance calculation method according to the fifth embodiment, in a similar manner to the third embodiment, it is possible to reduce the feeling of anxiety and the like given to the driver and reduce the risk of running out of electricity.

According to the fifth embodiment, the higher the degradation degree of power consumption ratio based on the information on the road that the vehicle travels, the larger the weight to the power consumption ratio of the shorter driving distance (smaller unit of driving) is set. Accordingly, when the vehicle is traveling on a highway or in a mountain area where the power consumption ratio is degraded, for example, the weight to the power consumption ratio of the shorter driving distance (smaller unit of driving) is increased. This can increase the accuracy of calculating the drivable distance and reduce the risk of running out of electricity.

Sixth Embodiment

Next, a description is given of a sixth embodiment of the present invention. A drivable distance calculation device 1 and a drivable distance calculation method according to the sixth embodiment are the same as those of the third embodiment but are different from those of the third embodiment in terms of a part of the process. Hereinafter, the different points from the third embodiment are described.

The arithmetic unit 11 of the sixth embodiment calculates plural power consumption ratios corresponding to environments of roads that the vehicle travels, and the DB 10 stores the plural power consumption ratios corresponding to the environments of roads that the vehicle travels. To be specific, the DB 10 stores power consumption ratios of roads other than ordinary roads and stores power consumption ratios of a highway, a mountain and hill road, and the like, for example. In the sixth embodiment, the arithmetic unit 11 therefore specifies a road that the vehicle is travelling based on radio waves from the GPS receiving unit 13 and map information stored in the DB 10 and calculates the drivable distance in the following manner.

To be specific, when the remaining battery capacity ≥α (kWh) and the vehicle is traveling a road other than ordinary roads, the arithmetic unit 11 selects a road environment power consumption ratio corresponding to the road environment and a power consumption ratio of γ m-drive and calculates the drivable distance based on Equation (5) of: drivable distance (km)=road environment power consumption ratio (km/kWh)×(remaining battery capacity−α (kWh))+power consumption ratio of γ m-drive (km/kWh)×α (kWh). In this case, the weights to the road environment power consumption ratio corresponding to the road environment and the power consumption ratio of γ m-drive are (the remaining battery capacity−α) and α, respectively.

When the remaining battery capacity ≥α (kWh) and the vehicle is traveling an ordinary road, the arithmetic unit 11 selects two power consumption ratios of β m-drive and γ m-drive and calculates the drivable distance based on Equation (3) of: drivable distance (km)=power consumption ratio of β m-drive (km/kWh)×(remaining battery capacity−α (kWh))+power consumption ratio of γ m-drive (km/kWh)×α (kWh). In this case, the weights to the power consumption ratios of β m-drive and γ m-drive are (the remaining battery capacity−α) and α, respectively.

When the remaining battery capacity <α (kWh), the arithmetic unit 11 selects two power consumption ratios of β m-drive and γ m-drive and calculates the drivable distance based on Equation (2) of: drivable distance (km)=power consumption ratio of γ m-drive (km/kWh)×remaining battery capacity (kWh). In this case, the weights to the power consumption ratios of β m-drive and γ m-drive are 0 and the remaining battery capacity (100%), respectively.

Figure 7:
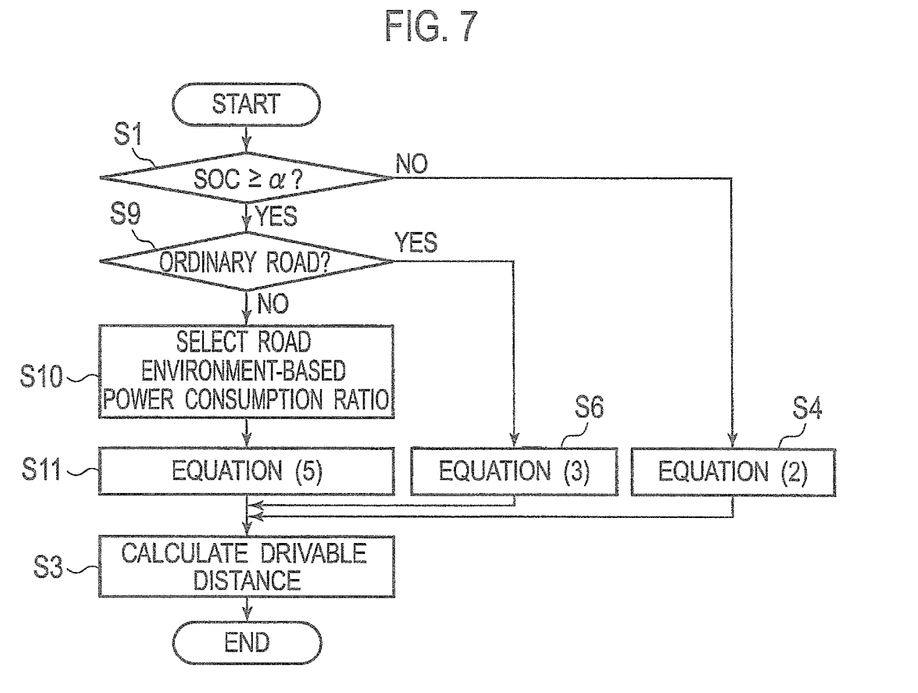
FIG. 7 is a flowchart showing a drivable distance calculation method according to the sixth embodiment.

FIG. 7 is a flowchart showing the drivable distance calculation method according to the sixth embodiment. The same steps in FIG. 7 as those of FIG. 4 are given the same reference numerals, and the description thereof is omitted.

As shown in FIG. 7, when determining that the remaining battery capacity is equal to or larger than the predetermined value α (S1: YES), the arithmetic unit 11 determines whether the vehicle is traveling an ordinary road (S9). When determining that the vehicle is not traveling an ordinary road (S9: NO), the arithmetic unit 11 selects a power consumption ratio corresponding to the road environment (S10). In this process, the arithmetic unit 11 also selects the power consumption ratio of γ m-drive.

The arithmetic unit 11 selects Equation (5) described above (S11), that is, calculates the drivable distance with the road environment power consumption ratio corresponding to the road environment and power consumption ratio of γ m-drive both weighted (S3). The process shown in FIG. 7 is then terminated.

On the other hand, when determining that the vehicle is traveling an ordinary road (S9: YES), the arithmetic unit 11 selects Equation (3) described above (S6), that is, selects the power consumption ratios of β m-drive and γ m-drive and calculates the drivable distance with the selected power consumption ratios both weighted (S3). The process shown in FIG. 7 is then terminated.

As described above, according to the drivable distance calculation device 1 and drivable distance calculation method according to the sixth embodiment, similarly to the third embodiment, it is possible to reduce the feeling of anxiety and the like given to the driver and reduce the risk of running out of electricity.

According to the sixth embodiment, plural power consumption ratios are calculated corresponding to environments of roads that the vehicle travels. It is therefore possible to calculate the power consumption ratios appropriate to the driving environments including a highway, a mountain area, and the like, thus increasing the accuracy of calculating the drivable distance.

Seventh Embodiment

Next, a description is given of a seventh embodiment of the present invention. A drivable distance calculation device 1 and a drivable distance calculation method according to the seventh embodiment are the same as those of the third embodiment but are different from those of the third embodiment in terms of a part of the process. Hereinafter, the different points from the third embodiment are described.

The arithmetic unit 11 of the seventh embodiment includes a function of determining whether the destination is set in a navigation system (not shown) and calculates plural power consumption ratios corresponding to whether the destination is set. The DB 10 stores the plural power consumption ratios corresponding to whether the destination is set. The arithmetic unit 11 of the seventh embodiment calculates the drivable distance in the following manner.

To be specific, when the remaining battery capacity ≥α (kWh) and the destination is set, the arithmetic unit 11 selects an average power consumption ratio to a reachable point on the route from the present location to the destination and the power consumption ratio of γ m-drive and calculates the drivable distance based on Equation (6) of: drivable distance (km)=average power consumption ratio (km/kWh)×(remaining battery capacity−α (kWh))+power consumption ratio of γ m-drive (km/kWh)×α (kWh). In this case, the weights of the average power consumption ratio and the power consumption ratio of γ m-drive are (the remaining battery capacity−α) and α, respectively. The average power consumption ratio may be calculated, for example, by various methods including calculation from the power consumption ratios for road environments stored in the DB 10 and calculation from the power consumption ratios from individual links.

When the remaining battery capacity ≥α (kWh) and the destination is not set, the arithmetic unit 11 selects the two power consumption ratios of β m-drive and γ m-drive and calculates the drivable distance based on Equation (3) of: drivable distance (km)=power consumption ratio of β m-drive (km/kWh)×(remaining battery capacity−α (kWh))+power consumption ratio of γ m-drive (km/kWh)×α (kWh). In this case, the weights to the power consumption ratios of β m-drive and γ m-drive are (the remaining battery capacity−α) and α, respectively.

When the remaining battery capacity <α (kWh), the arithmetic unit 11 selects the two power consumption ratios of β m-drive and γ m-drive and calculates the drivable distance based on Equation (2) of: drivable distance (km)= power consumption ratio of γ m-drive (km/kWh)×remaining battery capacity (kWh). In this case, the weights to the power consumption ratios of β m-drive and γ m-drive are 0 and the remaining battery capacity (100%), respectively.

Figure 8:
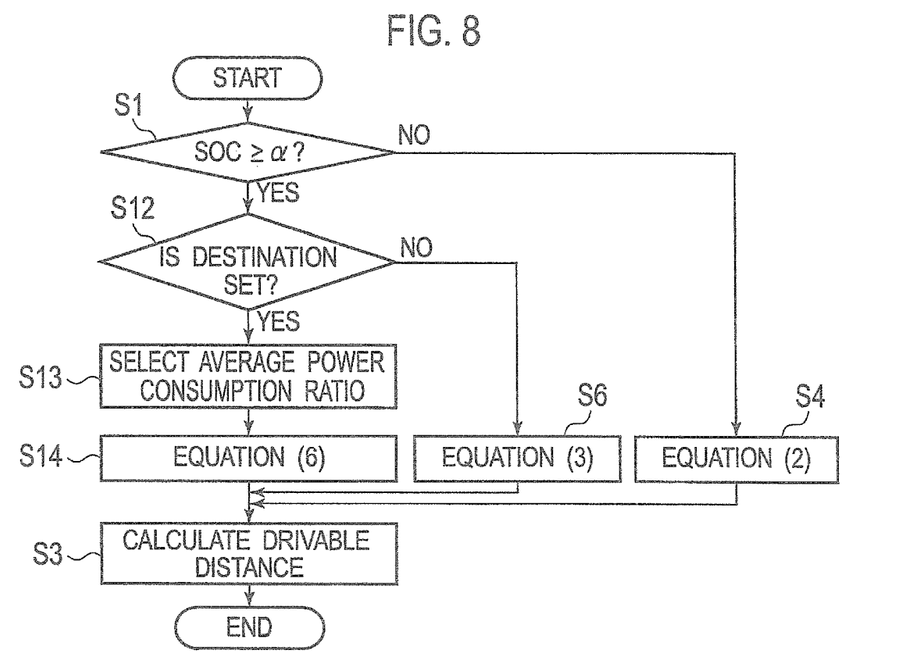
FIG. 8 is a flowchart showing a drivable distance calculation method according to the seventh embodiment.

FIG. 8 is a flowchart showing the drivable distance calculation method according to the seventh embodiment. The same steps in FIG. 8 as those of FIG. 4 are given the same reference numerals, and the description thereof is omitted.

As shown in FIG. 8, when determining that the remaining battery capacity is equal to or larger than the predetermined value α (S1: YES), the arithmetic unit 11 determines whether the determination is set (S12). When determining that the destination is set (S12: YES), the arithmetic unit 11 selects the average power consumption ratio to the reachable point on the route to the destination (S13). In this process, the arithmetic unit 11 also selects the power consumption ratio of γ m-drive.

The arithmetic unit 11 selects Equation (6) described above (S14), that is, calculates the drivable distance with the average power consumption ratio and the power consumption ratio of γ m-drive both weighted (S3). The process shown in FIG. 8 is then terminated.

On the other hand, when determining that the destination is not set (S12: NO), the arithmetic unit 11 selects Equation (3) described above (S6), that is, selects the power consumption ratios of β m-drive and γ m-drive and calculates the drivable distance with the selected power consumption ratios both weighted (S3). The process shown in FIG. 8 is then terminated.

As described above, according to the drivable distance calculation device 1 and method according to the seventh embodiment, similarly to the third embodiment, it is possible to reduce the feeling of anxiety and the like given to the driver and reduce the risk of running out of electricity.

According to the seventh embodiment, the drivable distance calculation device 1 and drivable distance calculation method calculates plural power consumption ratios corresponding to whether the destination is set in the navigation system installed in the vehicle, and the power consumption ratio on the route from the present location to the destination can be therefore calculated, thus increasing the accuracy of calculating the drivable distance.

Hereinabove, the present invention is described based on the embodiments but is not limited to the aforementioned embodiments. The present invention may be changed without departing from the scope of the invention, and the embodiments may be properly combined.

According to the present invention, when the remaining battery capacity is large, for example, the drivable distance is calculated by using the power consumption ratio of a longer driving distance (unit of driving) or longer driving time (unit of driving). This can prevent the calculated drivable distance from changing significantly and reduce the feeling of anxiety and the like given to the driver. On the other hand, when the remaining battery capacity is small, for example, the drivable distance is calculated by using the power consumption ratio of a shorter driving distance (unit of driving) or shorter driving time (unit of driving). This increases the accuracy of calculating the drivable distance and reduces the risk of running out of electricity.

What is claimed is:

1. A drivable distance calculation device that calculates a drivable distance that a vehicle can travel, the device comprising:
   a sensor that detects a remaining capacity of a battery installed in the vehicle;
   a storage that stores a plurality of power consumption ratios including at least a power consumption ratio of a short driving distance and a power consumption ratio of a long driving distance; and
   an arithmetic unit that calculates the drivable distance based on the remaining battery capacity detected by the sensor and a power consumption ratio selected from among the plurality of power consumption ratios stored on the storage, and outputs the calculated drivable distance to a display,
   wherein the arithmetic unit selects the power consumption ratio of the short driving distance from among the plurality of power consumption ratios stored on the storage when the remaining battery capacity detected by the sensor is smaller than a predetermined value.

2. The drivable distance calculation device according to claim 1, wherein the arithmetic unit selects the power consumption ratio of the short driving distance and the power consumption ratio of the long driving distance from among the plurality of power consumption ratios stored on the storage when the remaining battery capacity detected by the sensor is not smaller than the predetermined value.

3. The drivable distance calculation device according to claim 1, wherein the arithmetic unit calculates the plurality of power consumption ratios based on information from a plurality of sensors of the vehicle and stores the plurality of power consumption ratios on the storage.

4. The drivable distance calculation device according to claim 1, wherein the arithmetic unit selects a power consumption ratio of a shorter driving distance as a power consumption ratio degradation degree based on information concerning roads that the vehicle travels becomes higher.

5. The drivable distance calculation device according to claim 1, wherein, when the remaining battery capacity detected by the sensor is not smaller than a predetermined value, the arithmetic unit calculates the drivable distance by multiplying a power consumption ratio of a shorter driving distance among the plurality of power consumption ratios by the predetermined value and multiplying a power consumption ratio of a driving distance longer than the shorter driving distance by a value obtained by reducing the predetermined value from the remaining battery capacity.

6. The drivable distance calculation device according to claim 1, wherein the arithmetic unit calculates a plurality of power consumption ratios corresponding to road environments where the vehicle travels.

7. The drivable distance calculation device according to claim 1, wherein the arithmetic unit calculates a plurality of power consumption ratios corresponding to whether a destination is set in a navigation system installed in the vehicle.

8. The drivable distance calculation device according to claim 1, wherein the plurality of power consumption ratios is calculated based on drivers who drive the vehicle, or environments of roads the vehicle travels.

9. The drivable distance calculation device according to claim 1, wherein the arithmetic unit selects a power consumption ratio corresponding to a current driver or a driving environment.

10. A method for determining a drivable distance that a vehicle can travel, the method comprising:
    detecting a remaining capacity of a battery installed in the vehicle with a sensor;
    storing in a memory a plurality of power consumption ratios including at least a power consumption ratio of a short driving distance and a power consumption ratio of a long driving distance;
    calculating with a computer the drivable distance based on the remaining battery capacity detected by the sensor and a power consumption ratio selected from among the plurality of power consumption ratios stored on the storage, wherein the computer selects the power consumption ratio of the short driving distance from among the plurality of power consumption ratios stored in the memory when the remaining battery capacity detected by the sensor is smaller than a predetermined value; and
    displaying on a display the calculated drivable distance.

11. The method according to claim 10, further comprising:
    selecting the power consumption ratio of the short driving distance and the power consumption ratio of the long driving distance from among the plurality of power consumption ratios stored in the memory when the remaining battery capacity detected by the sensor is not smaller than the predetermined value.

12. The method according to claim 10, further comprises:
    calculating the plurality of power consumption ratios based on information from a plurality of sensors of the vehicle; and
    storing in the memory the plurality of power consumption ratios.

13. The method according to claim 10, further comprising:
    selecting a power consumption ratio of a shorter driving distance as a power consumption ratio degradation degree based on information concerning roads that the vehicle travels becomes higher.

14. The method according to claim 10, wherein, when the remaining battery capacity detected by the sensor is not smaller than a predetermined value, calculating the drivable distance includes multiplying a power consumption ratio of a shorter driving distance among the plurality of power consumption ratios by the predetermined value and multiplying a power consumption ratio of a driving distance longer than the shorter driving distance by a value obtained by reducing the predetermined value from the remaining battery capacity.

15. The method according to claim 10, further comprising:
    calculating a plurality of power consumption ratios corresponding to road environments where the vehicle travels.

16. The method according to claim 10, further comprising:
    calculating a plurality of power consumption ratios corresponding to whether a destination is set in a navigation system installed in the vehicle.

17. The method according to claim 10, wherein the plurality of power consumption ratios is calculated based on drivers who drive the vehicle, or environments of roads the vehicle travels.

18. The method according to claim 10, further comprising:
    selecting a power consumption ratio corresponding to a current driver or a driving environment.

* * * * *